United States Patent
Lu et al.

(10) Patent No.: US 8,402,626 B2
(45) Date of Patent: Mar. 26, 2013

(54) HEAT SINK INSTALLING DEVICE

(75) Inventors: Li-Che Lu, Taipei Hsien (TW); Chun-Yi Yin, Taipei Hsien (TW); Yi-Cheng Kuo, Taipei Hsien (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 929 days.

(21) Appl. No.: 12/494,321

(22) Filed: Jun. 30, 2009

(65) Prior Publication Data

US 2010/0236057 A1  Sep. 23, 2010

(30) Foreign Application Priority Data

Mar. 18, 2009 (CN) .......................... 2009 1 0300936

(51) Int. Cl.
  *B25B 27/14* (2006.01)
  *B23P 19/02* (2006.01)
  *H01R 43/00* (2006.01)
  *H05K 13/00* (2006.01)
  *H05K 7/20* (2006.01)
  *H05K 1/14* (2006.01)
  *B23P 19/00* (2006.01)

(52) U.S. Cl. ........... 29/281.5; 29/251; 29/856; 361/709; 361/700; 361/740

(58) Field of Classification Search ............... 29/281.5, 29/251, 856; 361/709, 700, 705, 707, 740
See application file for complete search history.

(56) References Cited

U.S. PATENT DOCUMENTS

| 4,630,172 | A | * | 12/1986 | Stenerson et al. | 361/718 |
| 4,804,172 | A | * | 2/1989 | Sokolovsky et al. | 269/254 R |
| 5,475,920 | A | * | 12/1995 | Burns et al. | 29/856 |
| 5,526,234 | A | * | 6/1996 | Vinciarelli et al. | 361/740 |
| 5,663,869 | A | * | 9/1997 | Vinciarelli et al. | 361/707 |
| 5,706,171 | A | * | 1/1998 | Edwards et al. | 361/705 |
| 6,215,939 | B1 | * | 4/2001 | Cloud | 385/135 |
| 6,904,654 | B2 | * | 6/2005 | Desiderio et al. | 29/281.5 |
| 2003/0174468 | A1 | * | 9/2003 | Park et al. | 361/700 |
| 2009/0027859 | A1 | * | 1/2009 | Giacoma | 361/709 |
| 2010/0269517 | A1 | * | 10/2010 | Ikeda et al. | 62/3.7 |

\* cited by examiner

*Primary Examiner* — Lee D Wilson
*Assistant Examiner* — Alvin Grant
(74) *Attorney, Agent, or Firm* — Altis Law Group, Inc.

(57) ABSTRACT

A heat sink installing device includes a base, a pair of guiding poles, a slidable cover, a pair of latches and a number of auxiliary wings. The pair of guiding poles is perpendicularly mounted on the base and separated from each other. The slidable cover is slidably fitted on the pair of guiding poles and defines a pair of through holes running through two opposite side surfaces of the slidable cover. Each of the latches is mounted on the slidable cover and latched on one of the guiding poles correspondingly. The plurality of auxiliary wings are correspondingly attached on a side surface of the slidable cover around the through hole and inclined towards the center of the through hole by a distal end thereof away from the slidable cover.

17 Claims, 6 Drawing Sheets

HEAT SINK INSTALLING DEVICE

BACKGROUND

1. Technical Field

The disclosure relates to attaching devices and, more particularly, to a heat sink installing device.

2. Description of the Related Art

In assembling, heat sinks are attached to the electronic devices manually, which often leads to low positioning precision in aligning with the electronic elements to cool them effectively. In addition, the heat sinks are prone to be damaged in assembling due to the thin configuration of the heat sinks, and damaged heat sinks will reduce the efficiency of heat dispersion.

Therefore, what is needed is to provide a heat sink installing device providing auxiliary attachment in assembling the heat sinks, in which the above problem is eliminated or at least alleviated.

DETAILED DESCRIPTION

Figure 1:
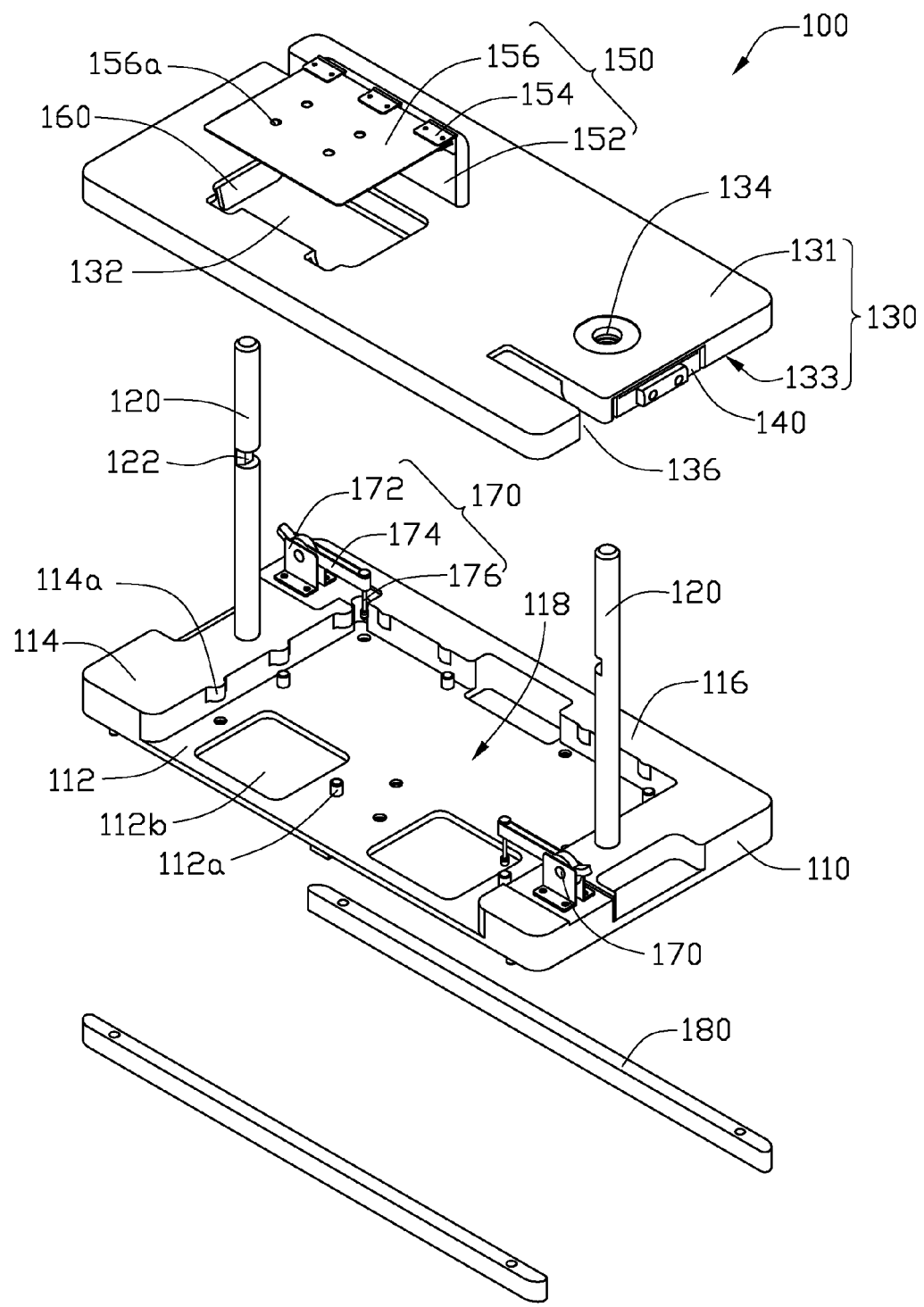
FIG. 1 is an isometric, exploded view of a heat sink installing device according to an exemplary embodiment.
Figure 2:
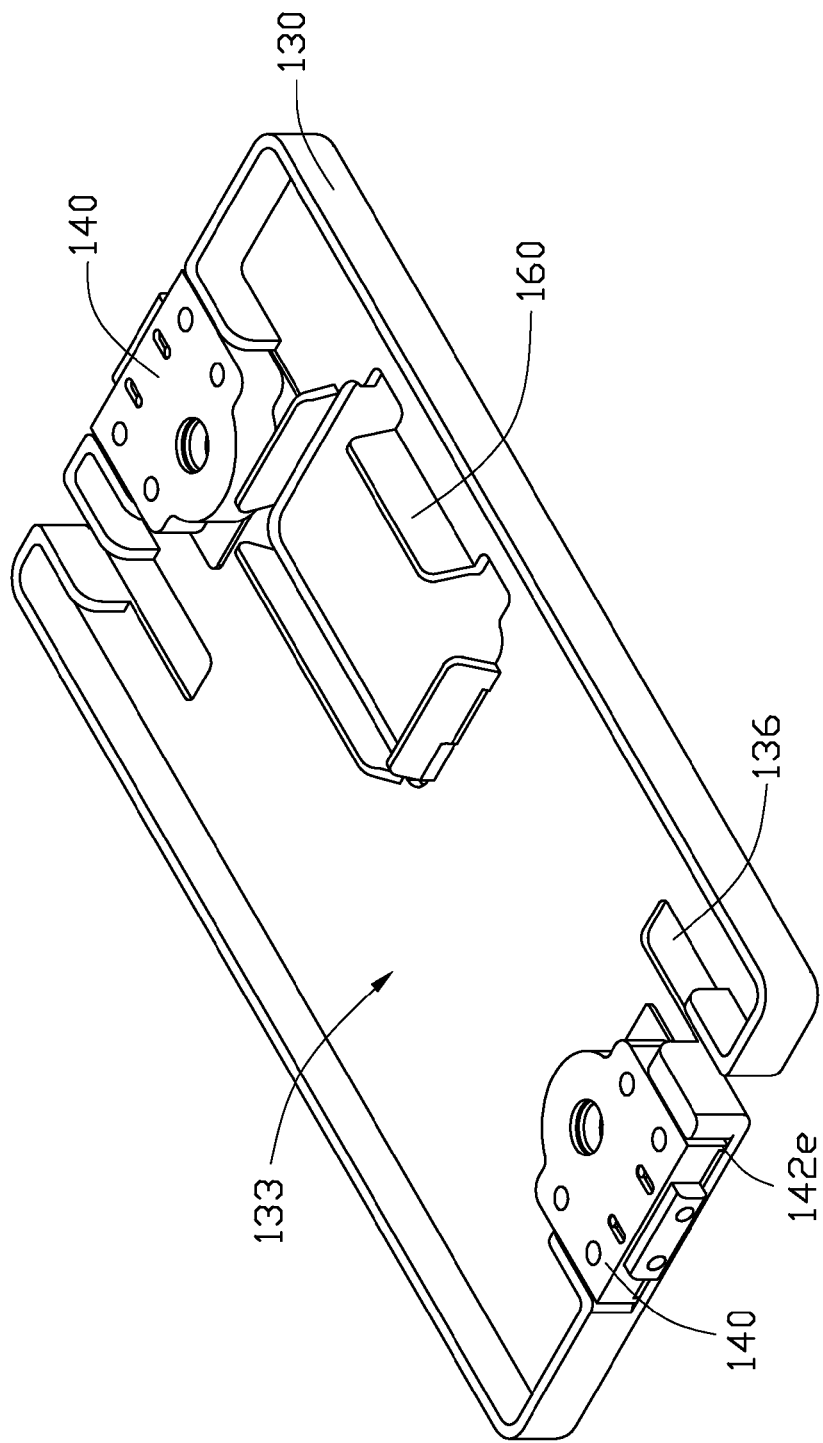
FIG. 2 is an isometric view of a slidable cover of the heat sink installing device of FIG. 1.

Referring to FIGS. 1 and 2, a heat sink installing device 100 according to an exemplary embodiment includes a base 110, a pair of guiding poles 120, a slidable cover 130, a pair of latches 140, an aligning tool 150, a number of auxiliary wings 160, a pair of clamps 170 and a pair of support pads 180. The pair of the guiding poles 120 is perpendicularly mounted on the base 110 and separated from each other at a certain distance. The slidable cover 130 is slidably fitted on the pair of guiding poles 120 and defines a pair of through holes 132 running through two opposite side surfaces of the slidable cover 130. The pair of latches 140 is mounted on the slidable cover 130 and latched on the corresponding guiding poles 120 to locate the slidable cover 130 on the guiding poles 120. The aligning tool 150 and the auxiliary wings 160 are correspondingly attached on opposite side surfaces of the slidable cover 130 around the through hole 132 and adjacent to a different side of the through hole 132. The pair of clamps 170 is attached on the base 110 adjacent to one of the guiding poles 120. The pair of support pads 180 is mounted on a side surface of the base 110 opposite to the surface mounted with the guiding poles 120.

The base 110 is a rectangular sheet including a substrate 112, a pair of protrusions 114 projecting upwards from two opposite end edges of the substrate 112, and a projection 116 projecting upwards along an edge of the substrate 112 perpendicularly connecting to the pair of protrusions 114. The substrate 112, the pair of protrusions 114, and the projection 116 cooperatively define a receiving housing 118 to receive a portion of a work-piece. The substrate 112 includes a number of locating poles 112a and a window 112b. The locating poles 112a are perpendicularly formed on a surface of the substrate 112 and positioned in the receiving housing 118 to locate the work-piece in the receiving housing 118. The window 112b is defined through the substrate 112 and communicating with the receiving housing 118 for protecting some protrusions formed on the work-piece. Each of the protrusions 114 further includes a number of jutting members 114a formed on an inner side surface and projecting to the receiving housing 118 for latching the work-piece.

The guiding poles 120 are perpendicularly mounted on the protrusions 114 of the base 110 correspondingly. Each of the guiding poles 120 defines a cutout 122 in the middle portion thereof apart from the base 110 along a direction perpendicular to a center axis of the guiding pole 120.

The slidable cover 130 is a rectangular plate corresponding the shape of the base 110 and slidably fitted on the pair of guiding poles 120. The slidable cover 130 includes an upper surface 131 and a lower surface 133 opposite to the upper surface 131. The slidable cover 130 defines a pair of guiding holes 134 therethrough corresponding to the pair of guiding poles 120 of the base 110 for fitting on the guiding poles 120. The slidable cover 130 further defines a pair of avoiding channels 136 therein running through the upper and lower surfaces 131, 133 of the slidable cover 130 corresponding to the clamps 170.

Figure 3:
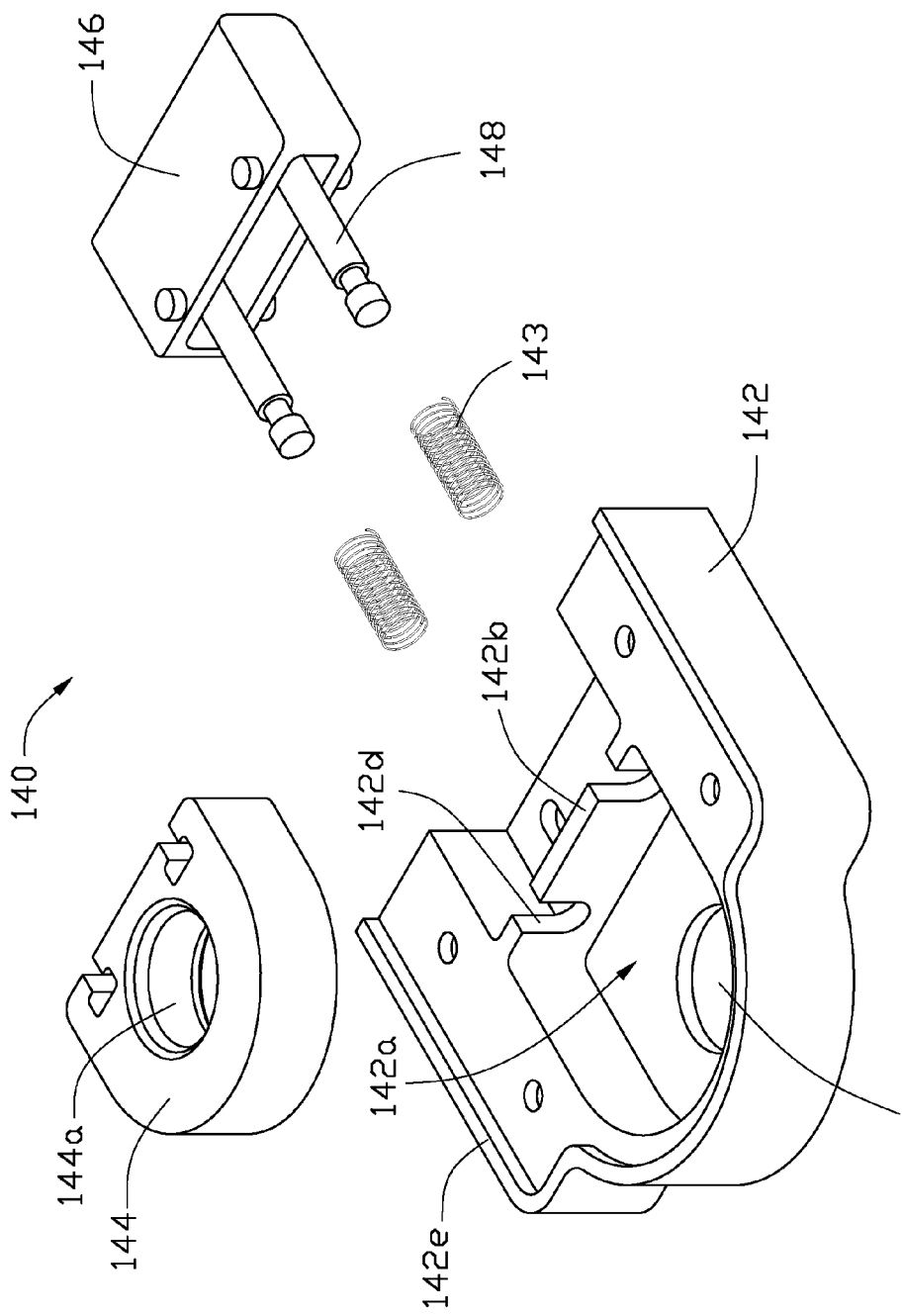
FIG. 3 is an isometric, exploded view of a latch of the heat sink installing device of FIG. 1.
Figure 4:
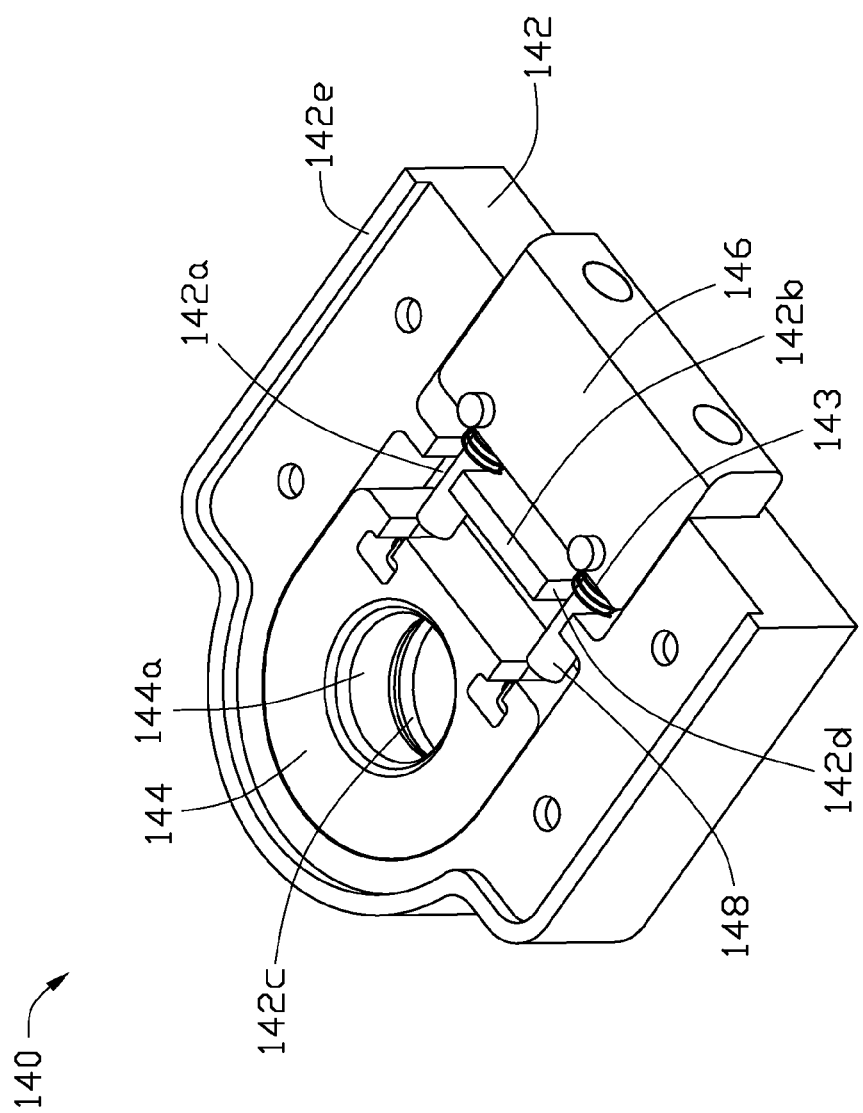
FIG. 4 is an isometric, assembled view of the latch of the heat sink attaching shown in FIG. 3.

Referring FIGS. 2 to 4, the latch 140 includes a main body 142, a locking block 144, a push button 146, a pair of connecting pins 148 and a pair of springs 143. The main body 142 includes an open end cavity 142a defined therein and a spacer 142b formed on the middle portion of the cavity 142a. The locking block 144 is positioned in the cavity 142a abutting a side surface of the spacer 142b. The push button 146 is positioned in the cavity 142a abutting another opposite side surface of the spacer 142b. The connecting pins 148 pass through the spacer 142b and connect the locking block 144 and the push button 146 together. The springs 143 are compressedly positioned between the spacer 142b and a side surface of the push button 146.

The main body 142 is attached on the lower surface 133 of the slidable cover 130 and defines an orifice 142c on the bottom of the cavity 142a corresponding to the guiding pole 120. The orifice 142c is coaxial with the guiding holes 134 when the slidable cover 130 is assembled on the base 110 via the guiding pole 120. The spacer 142b of the main body 142 defines a pair of passages 142d therein for the pair of connecting pins 148 passing through. The spacer 142b is perpendicularly formed on the bottom of the cavity 142a limiting the movable range of the locking block 144 in the cavity 142a. The main body 142 further includes a flange 142e formed along an edge of a surface. The flange 142e is abutted on the lower surface 133 of the slidable cover 130 and therefore forming a gap between the main body 142 and the slidable cover 130 allowing the locking block 144 sliding freely therein when the latch 140 is mounted on the slidable cover 130.

The locking block 144 and the push button 146 are separately positioned in the cavity 142a and separated by the spacer 142b. The locking block 144 is shaped corresponding to the shape of the cavity 142a and moves away from the spacer 142b in the cavity 142a when the push button 146 is pushed toward to the locking block 144, thereby the locking block 144 can be moved towards or away relative to the spacer 142b. The locking block 144 defines an aperture 144a corresponding to the orifice 142c of the main body 142 and fitted on the guiding pole 120. The at least one connecting pin 148 passes through the passage 142d of the spacer 142b and connects the push button 146 and the locking block 144 by opposite ends thereof. The spring 143 is sleeved on the connecting pin 148 and is compressed between the spacer 142b and the push button 146 to keep the locking block 144 abutting on the spacer 142b via the push button 146 and the connecting pin 148, and therefore the aperture 144a of the locking block 144 is displaced from the axis of the orifice 142c of the main body 142.

Referring back to FIG. 1, the aligning tool 150 includes a support plate 152, a number of hinges 154, and a covering plate 156. The support plate 152 is perpendicularly mounted on the upper surface 131 of the slidable cover 130 adjacent to a side of the through hole 132. The covering plate 156 is pivoted on an upper end of the support plate 152 by the hinges 154 and apart away from the slidable cover 110. The covering plate 156 is able to rotate to a position where it is parallel to the slidable cover 130 and aligned with the through hole 132 defined in the slidable cover 130. The covering plate 156 defines a number of openings 156a therein for providing a precise reference through a number of bolts (not shown) are used to assembly the heat sink precisely.

The auxiliary wings 160 are mounted on the lower surface 133 of the slidable cover 130 along another side of the through hole 132 adjacent to the side mounting the aligning tool 150 and inclined towards a center of the through hole 132 at a distal end thereof away from the slidable cover 130. The auxiliary wings 160 are configured for having the fins of the heat sink to be assembled to align with each other by the especial configuration thereof.

Each of the clamps 170 includes a holder 172, a hanging arm 174, and a pressing leg 176. The holder 172 is mounted on one of the protrusions 114 abutting the adjacent guiding pole 120. The hanging arm 174 is pivotally mounted on the holder 172 by one end thereof. The pressing leg 176 is perpendicularly connected on the free end away from the pivoted end of the hanging arm 174. The clamps 170 are configured for pressing and fixing a circuit board in the receiving housing 118 to be assembled with a heat sink by the pressing leg 176.

The support pads 180 are separately mounted on the bottom surface of the substrate 112 opposite to the receiving housing 118 for stably supporting the base 110.

In assembly, the locking block 144 is moved along the bottom of the cavity 142a by pushing the button 146 of the latch 140 to coaxially align the aperture 144a with the guiding holes 134 of the slidable cover 130 and the orifice 142c of the main body 142. Then, the slidable cover 130 and the latch 140 are fitted on the guiding poles 120 through the orifice 142c, aperture 144a, and guiding holes 134. As the moving of the latch 140 along the guiding poles 120, the locking block 144 can be forcedly inserted into the cutout 122 by a resilience of the compressed spring 143. The slidable cover 130 and latch 140 are supported on the guiding poles 120 over the base 110.

Figure 5:
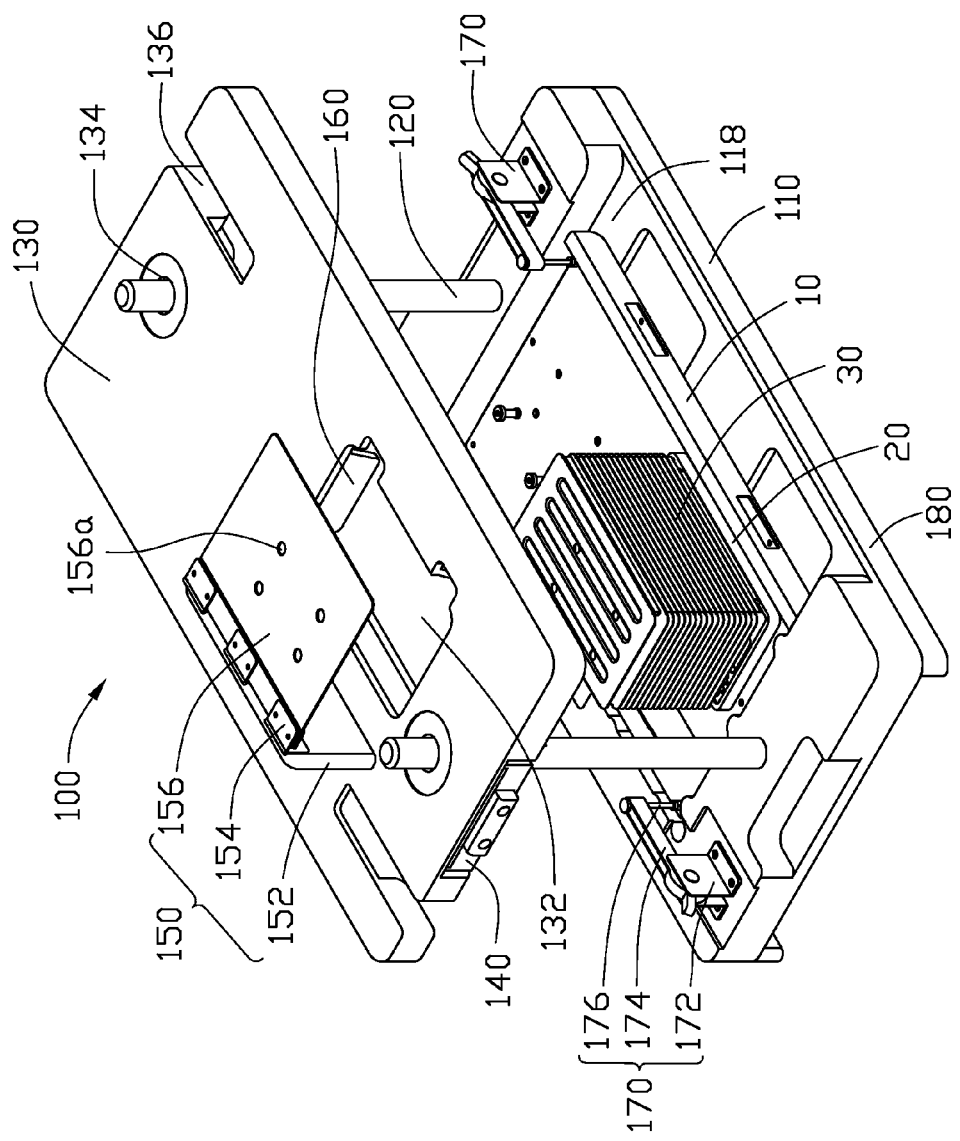
FIG. 5 is an isometric view showing usage of the heat sink installing device of FIG. 1 in a phase of use.
Figure 6:
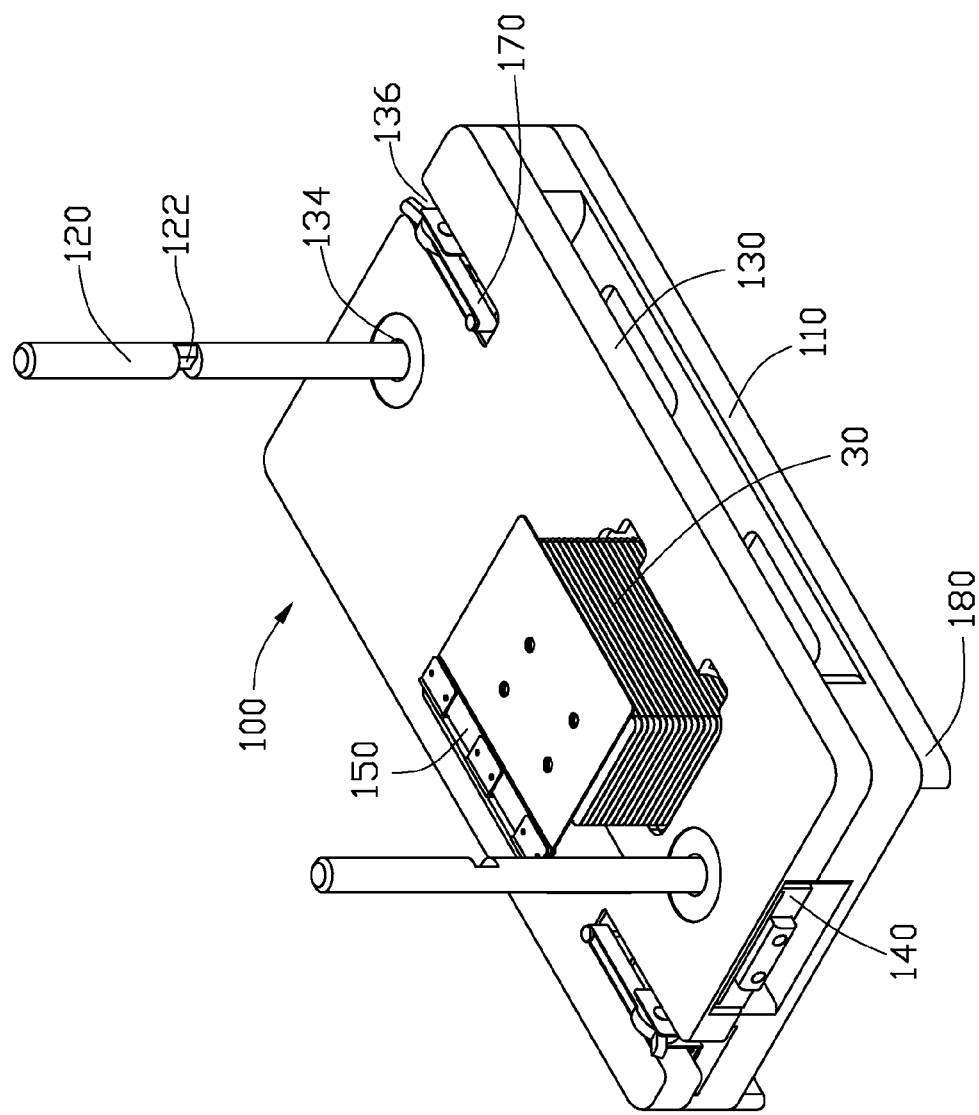
FIG. 6 is an isometric view showing usage of the heat sink installing device of FIG. 1 in another phase of use.

Referring FIGS. 5 and 6, in use, a circuit board 10 is positioned in the receiving housing 118 on the base 110. The clamps 170 fasten the circuit board 10 by the pressing leg 176 thereof. The locating poles 112a of the base 110 insert into holes (not label) defined on the circuit board 10 to precisely locate the circuit board 10. A thermal conductive pad 20 and fins 30 of a heat sink (not labeled) to be assembled are stacked on the circuit board 10 in turns. Then, the push button 146 of the latch 140 is pushed inwards to force the locking block 144 to disengage from the cutout 122 of the guiding poles 120. After the locking block 144 is disengaged from the cutout 122 of the guiding poles 120, the slidable cover 130 as well as the latch 140 slide along the guiding poles 120 down to the protrusions 114 and the projection 116 of the base 110. The fins 30 of the heat sink pass through the through hole 132 of the slidable cover 130 and are aligned with each other via the auxiliary wings 160. In this embodiment, a tolerance clearance between the distal ends of the auxiliary wings 160 and the edges of the fins 30 is predefined at 0.5 millimeter to precisely align the fins 30 of the heat sink, and if one of the fins 30 is out of alignment, the auxiliary wings 160 will guide the one of fins 30 into a correct position. Furthermore, a tolerance clearance between roothold portions of the auxiliary wings 160 adjacent to the slidable cover 130 and the edges of the fins 30 is predefined at 5.7 millimeter for preventing the fins 30 from damage by the auxiliary wings 160. In sequence, the covering plate 156 is overlapped one the upper surface of one of upper fins 30, and the openings 156a are aligned to the thread holes predefined on the fins 30, the thermalconductive pad 20, and the circuit board 10. A number of bolts (not label) are screwed in the thread holes correspondingly to install the fins 30 and the thermal conductive pad 20 on the circuit board 10. Finally, the slidable cover 130 and the latch 140 are lifted and stopped at the cutout 122 in the guiding poles 120.

It is believed that the present embodiments and their advantages will be understood from the foregoing description, and it will be apparent that various changes may be made thereto without departing from the spirit and scope of the disclosure or sacrificing all of its material advantages, the examples hereinbefore described merely being preferred or exemplary embodiments of the disclosure.

What is claimed is:

1. A heat sink installing device comprising:
   a base;
   a pair of guiding poles perpendicularly mounted on the base and separated from each other;
   a slidable cover slidably fitted on the pair of guiding poles and defining at least one through hole therein;
   a pair of latches mounted on the slidable cover and latched on the corresponding guiding poles, each one of the pair of latches comprising a main body which comprises an open end cavity formed therein and a spacer positioned on a middle portion of the cavity, a locking block positioned in the cavity abutting a side surface of the spacer, a push button positioned in the cavity abutting another opposite side surface of the spacer, a pair of connecting pins passing through the spacer and connecting the locking block and the push button, and a pair of springs positioned between the spacer and a side surface of the push button; and
   a plurality of auxiliary wings correspondingly attached on a side surface of the slidable cover around the at least one through hole and inclined towards the center of the at least one through hole by a distal end thereof away from the slidable cover.

2. The heat sink installing device as claimed in claim 1, further comprising an aligning tool comprising a support plate perpendicularly mounted on the slidable cover adjacent to the through hole at another surface opposite to the auxiliary wings, a plurality of hinges, and a covering plate pivoted on an upper end by the hinges and apart away from the slidable cover.

3. The heat sink installing device as claimed in claim 2, wherein the base comprises a substrate, a pair of protrusions projecting upwards from two corresponding end edges of the substrate, and a projection projecting upwards along an edge of the substrate and perpendicularly connecting to the pair of the protrusions; and the substrate, the protrusions and the projection cooperatively define a receiving housing.

4. The heat sink installing device as claimed in claim 3, wherein the base further comprises a plurality of locating poles perpendicularly formed on a surface thereof and stood in the receiving housing for locating a work-piece in the receiving housing.

5. The heat sink installing device as claimed in claim 3, wherein the guiding poles are perpendicularly mounted on the protrusions of the base, respectively, and each of the guiding poles defines a cutout on the middle portion thereof along a direction perpendicular to a center axis of the guiding pole.

6. The heat sink installing device as claimed in claim 5, wherein the slidable cover comprises an upper surface and an opposite lower surface; and a pair of guiding holes is defined therein corresponding to the pair of the guiding poles and fitting on the guiding poles.

7. The heat sink installing device as claimed in claim 1, wherein the main body is attached on the lower surface of the slidable cover and defines an orifice on the bottom of the cavity; and the orifice is coaxial with the guiding holes and fitting on the guiding pole.

8. The heat sink installing device as claimed in claim 7, wherein the spacer of the main body defines a pair of passages therein; and the connecting pins pass through the passages of the spacer and connect the push button and the locking block by opposite ends thereof.

9. The heat sink installing device as claimed in claim 8, wherein the locking block defines an aperture corresponding to the orifice of the main body and fitted on the guiding pole; and the springs are compressed between the spacer and the push button to keep the locking block abutting on the spacer.

10. The heat sink installing device as claimed in claim 3, further comprising a pair of clamps attached on the base adjacent to the corresponding guiding poles for fastening a work-piece, respectively.

11. The heat sink installing device as claimed in claim 10, wherein each clamp comprises a holder mounted on one of the protrusions abutting the adjacent guiding pole, a hanging arm pivoted on the holder by one end thereof, and a pressing leg perpendicularly connected on the free end away from the pivoted end of the hanging arm.

12. The heat sink installing device as claimed in claim 11, wherein the slidable cover defines a pair of avoiding channels running through two opposite side surfaces of the slidable cover corresponding to the clamps.

13. The heat sink installing device as claimed in claim 3, further comprising a pair of support pads mounted on a bottom surface of the substrate opposite to the receiving housing.

14. The heat sink installing device as claimed in claim 3, wherein the substrate defines a window through the substrate and communicating with the receiving housing.

15. The heat sink installing device as claimed in claim 3, wherein each of the protrusions comprises a plurality of jutting members separately formed on the inner side surface and projecting to the receiving housing.

16. The heat sink installing device as claimed in claim 2, wherein the covering plate defines a number of openings therein.

17. A heat sink installing device comprising:
  a base comprising a substrate, a pair of protrusions projecting upwards from two corresponding end edges of the substrate, and a projection projecting upwards along an edge of the substrate and perpendicularly connecting to the pair of the protrusions; and the substrate, the protrusions and the projection cooperatively defining a receiving housing;
  a pair of guiding poles perpendicularly mounted on the protrusions of the base and separated from each other, and each of the guiding poles defining a cutout on a middle portion thereof along a direction perpendicular to a center axis of the guiding pole;
  a slidable cover slidably defining a pair of guiding holes therein corresponding to the pair of the guiding poles to be fitted on the pair of guiding poles, defining at least one through hole therein, and comprising an upper surface and an opposite lower surface;
  an aligning tool comprising a support plate perpendicularly mounted on the slidable cover adjacent to the through hole at another surface opposite to the auxiliary wings, a plurality of hinges, and a covering plate pivoted on an upper end by the hinges and apart away from the slidable cover;
  a pair of latches mounted on the slidable cover and latched on the corresponding guiding poles, each one of the pair of latches comprising a main body which comprises an open end cavity formed therein and a spacer positioned on a middle portion of the cavity, a locking block positioned in the cavity abutting a side surface of the spacer, a push button positioned in the cavity abutting another opposite side surface of the spacer, a pair of connecting pins passing through the spacer and connecting the locking block and the push button, and a pair of springs positioned between the spacer and a side surface of the push button; and
  a plurality of auxiliary wings correspondingly attached on a side surface of the slidable cover around the at least one through hole and inclined towards the center of the at least one through hole by a distal end thereof away from the slidable cover.

* * * * *